(12) United States Patent
Hasegawa et al.

(10) Patent No.: US 8,952,269 B2
(45) Date of Patent: Feb. 10, 2015

(54) WIRING SUBSTRATE, MULTI-PIECE WIRING SUBSTRATE ARRAY, AND MANUFACTURING METHOD THEREFOR

(75) Inventors: Masami Hasegawa, Konan (JP); Satoshi Hirayama, Ichinomiya (JP); Naoki Kito, Nagoya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 14/111,486

(22) PCT Filed: Feb. 1, 2012

(86) PCT No.: PCT/JP2012/000668
§ 371 (c)(1),
(2), (4) Date: Oct. 11, 2013

(87) PCT Pub. No.: WO2012/157152
PCT Pub. Date: Nov. 22, 2012

(65) Prior Publication Data
US 2014/0037912 A1    Feb. 6, 2014

(30) Foreign Application Priority Data

May 19, 2011    (JP) .................. 2011-112398

(51) Int. Cl.
*H05K 1/11* (2006.01)
*B32B 3/00* (2006.01)
(Continued)

(52) U.S. Cl.
CPC ............ *H05K 1/0306* (2013.01); *H05K 3/0044* (2013.01); *H05K 3/0052* (2013.01);
(Continued)

(58) Field of Classification Search
USPC .......... 174/250, 255, 256, 261–266; 428/256, 428/172; 29/829
See application file for complete search history.

(56) References Cited

U.S. PATENT DOCUMENTS 4,963,843 A * 10/1990 Peckham ................ 333/203
5,644,107 A * 7/1997 Kubota et al. ............ 174/262
(Continued)

FOREIGN PATENT DOCUMENTS

JP    H07-192961 A    7/1995
JP    200488027 A1    3/2004
(Continued)

OTHER PUBLICATIONS

JPO/ISR, International Search Report issued in the instant international application, PCT/JP2012/000668, mailed May 22, 2012.
(Continued)

*Primary Examiner* — Hoa C Nguyen
(74) *Attorney, Agent, or Firm* — Stites & Harbison PLLC; Jeffrey A. Haeberlin

(57) ABSTRACT

Provided are a wiring substrate; a multi-piece wiring substrate array; and a method for reliably producing the multi-piece wiring substrate array. The wiring substrate includes a substrate main body, which has first and second main surfaces, side surfaces, a groove surface, and a fracture surface; and a notch which has a concave shape in plan view, and which is provided on a side surface on a side toward the first main surface, wherein, in the side surface having the notch, the boundary between the groove surface and the fracture surface has first curved portions on opposite sides of the notch, the first curved portions being convex toward the first main surface in side view; and also has a second curved portion on a second-main-surface side of the notch, the second curved portion being convex toward the second main surface of the substrate main body in side view.

10 Claims, 6 Drawing Sheets

(51) Int. Cl.
*H05K 1/03* (2006.01)
*H05K 3/00* (2006.01)
*H05K 3/38* (2006.01)
*H05K 3/40* (2006.01)

(52) U.S. Cl.
CPC ............... *H05K 3/381* (2013.01); *H05K 3/403* (2013.01); *H05K 1/113* (2013.01); *H05K 2203/107* (2013.01); *H05K 2201/0909* (2013.01); *H05K 2201/09181* (2013.01); *H05K 2201/09845* (2013.01)
USPC ........... 174/265; 174/256; 174/261; 428/156; 428/172; 29/829

(56) References Cited

U.S. PATENT DOCUMENTS

| | | | |
|---|---|---|---|
| 5,966,052 A * | 10/1999 | Sakai | 331/68 |
| 6,278,178 B1 * | 8/2001 | Kwon et al. | 257/684 |
| 6,576,999 B2 * | 6/2003 | Sakai et al. | 257/730 |
| 6,760,227 B2 * | 7/2004 | Sakai et al. | 361/736 |
| 7,919,717 B2 * | 4/2011 | Braman et al. | 174/262 |
| 8,279,610 B2 * | 10/2012 | Iizuka et al. | 361/748 |
| 2012/0112622 A1 * | 5/2012 | Suzuki et al. | 313/326 |

FOREIGN PATENT DOCUMENTS

| | | |
|---|---|---|
| JP | 2005-051036 A | 2/2005 |
| JP | 2008-198905 A | 8/2008 |
| JP | 2009-218319 A | 9/2009 |
| JP | 2009266992 A | 11/2009 |
| JP | 2012-156382 A | 8/2012 |

OTHER PUBLICATIONS

Submission of Publications (identity of submitter omitted), received in corresponding Japanese application No. 2011-112398, Date of submission: Sep. 6, 2014.

* cited by examiner

US 8,952,269 B2

WIRING SUBSTRATE, MULTI-PIECE WIRING SUBSTRATE ARRAY, AND MANUFACTURING METHOD THEREFOR

TECHNICAL FIELD

The present invention relates to a wiring substrate having few burrs in the vicinity of a notch located on a side surface of a substrate main body, in which breakage of a conductor layer provided on the inner wall of the notch is suppressed; to a multi-piece wiring substrate array for providing a plurality of the wiring substrates; and to a method for producing the multi-piece wiring substrate array.

BACKGROUND ART

Generally, ceramic wiring substrates are produced by separating a multi-piece ceramic wiring substrate array into individual pieces along dividing grooves provided on the front surface or back surface of the wiring substrate array. In connection therewith, there has been proposed a method for producing a multi-piece wiring substrate array, in which a blade having a specific edge angle is pressed against a green sheet laminate at positions where dividing grooves are to be formed, so that chips or burrs are less likely to be generated at a metal layer, etc. located in the vicinity of the thus-formed dividing grooves during separation of the substrate array (see, for example, Patent Document 1).

However, when dividing grooves are formed in a green sheet by means of a blade through the production method described in Patent Document 1, since a fracture surface (cracking) meanders at the inner wall of a through hole or bottomed hole which is to become a notch and which crosses with the thus-formed dividing grooves in a radial direction of the hole, burrs or cracks are likely to be generated. In addition, since the depth of a dividing groove formed by means of the aforementioned blade must be smaller than that of the position of a plating wire for connecting the internal wirings of two adjacent wiring substrate units, the dividing groove must be formed to be shallower than the bottom of a bottomed hole or shallower than a stepped portion of a through hole having two concentric portions of different inner diameters, which results in easy generation of burrs, etc.

Also, when a metal conductor layer is formed on the inner wall of the through hole, burrs are likely to be generated through breakage of the metal layer, and a cut surface of the non-plated conductor layer is exposed after separation of the substrate array. Therefore, the conductor layer may exhibit poor reliability during soldering for mounting of a component on the conductor layer.

Meanwhile, there has been proposed a multi-piece wiring substrate array, in which a dividing groove having different, discontinuous depths is formed by means of a special blade having a single base and different edge heights (widths), so as to prevent burrs or cracks, which would otherwise be generated in association with a meandering fracture surface (cracking) at the inner wall of a through hole in a green sheet (see, for example, Patent Document 2).

However, in the case of the multi-piece wiring substrate array described in Patent Document 2, every time a through-hole-forming position is changed to any position which crosses with a dividing groove, there must be provided a number of special blades having different edge heights (widths) and lengths corresponding to both a portion in the vicinity of the surface of a green sheet and a portion in the vicinity of a through hole. Thus, the multi-piece wiring substrate array poses a problem in that various types of special blades are required, which results in considerably high production cost and low productivity.

PRIOR ART DOCUMENT

Patent Document

Patent Document 1: Japanese Patent Application Laid-Open (kokai) No. 2009-218319 (pp. 1 to 11, FIGS. 1 to 8)
Patent Document 2: Japanese Patent Application Laid-Open (kokai) No. 2009-266992 (pp. 1 to 11, FIGS. 1 to 8)

SUMMARY OF THE INVENTION

Problems to be Solved by the Invention

An object of the present invention is to solve problems described in the Background Art section, and to provide a wiring substrate having few burrs in the vicinity of a notch located on a side surface of a substrate main body, in which breakage of a conductor layer provided on the inner wall of the notch is suppressed. Another object of the present invention is to provide a multi-piece wiring substrate array for providing a plurality of the wiring substrates. Yet another object of the present invention is to provide a method for reliably producing the multi-piece wiring substrate array.

Means for Solving the Problems and Effects of the Invention

In order to solve the aforementioned problems, the present invention has been achieved on the basis of the idea that a dividing groove of a green sheet is formed such that the depth of the dividing groove at a position where it crosses with a through hole or a bottomed hole of the green sheet—the hole to become a notch located on a side surface of each wiring substrate—is greater than that of the dividing groove at a position where it does not cross with the through hole or the bottomed hole.

Accordingly, the present invention provides a first wiring substrate (claim 1), comprising a substrate main body which is formed of a plurality of stacked ceramic layers, which has a rectangular shape in plan view, which has a pair of opposite first and second main surfaces, and which has side surfaces each being located between the paired main surfaces, and having a groove surface located on a side toward the first main surface and a fracture surface located between the groove surface and the second main surface; and a notch which has a concave shape in plan view, and which is provided on a side surface at least on a side toward the first main surface so as to extend in a thickness direction of the side surface, the wiring substrate being characterized in that, in the side surface having the notch, the boundary between the groove surface and the fracture surface has first curved portions on opposite sides of the notch, the first curved portions being convex toward the first main surface of the substrate main body in side view, and also has a second curved portion on a second-main-surface side of the notch, the second curved portion being convex toward the second main surface of the substrate main body in side view.

As used herein, a first main surface and a second main surface of the paired main surfaces are described relative to each other. For example, when the first main surface is the back surface of the substrate main body, the second main surface is the front surface of the substrate main body.

Examples of the ceramic material include high-temperature fired ceramic materials such as alumina, mullite, and aluminum nitride; and low-temperature fired ceramic materials such as glass-ceramic material.

The aforementioned groove surface corresponds to one of the inner wall surfaces of a dividing groove exposed on each side surface of an individual wiring substrate, the wiring substrate being produced by separating a multi-piece wiring substrate array into individual pieces along dividing grooves (each having a V-shaped cross section) formed, through laser processing, on a main surface of the below-described green sheet laminate which is to become the multi-piece wiring substrate array.

Preferably, the groove surface has a width (depth in a thickness direction) which is 50% or less of the width (in a thickness direction) of the corresponding side surface of the substrate main body. In this case, there can be readily prevented breakage of a plating wire for connecting the internal wirings of adjacent wiring substrate units of the below-described multi-piece wiring substrate array, which breakage would otherwise occur through formation of a dividing groove between the wiring substrate units. Thus, an end surface of the plating wire formed on a wiring substrate is exposed on the first-main-surface-side fracture surface of a side surface at a position shallower than the deepest portion of a notch provided on the side surface.

The aforementioned notch may be formed on all the four side surfaces of the wiring substrate, or may be formed only on one, two, or three side surfaces of the wiring substrate. The below-described conductor layer is formed at least on the inner wall of the notch, and the conductor layer serves as an external connection terminal for achieving electrical conduction between the internal wiring of the wiring substrate and an external component.

The present invention also provides a second wiring substrate (claim 2), comprising a substrate main body which is formed of a plurality of stacked ceramic layers, which has a rectangular shape in plan view, which has a pair of opposite first and second main surfaces, and which has side surfaces each being located between the paired main surfaces, and having a groove surface located on a side toward the first main surface and a fracture surface located between the groove surface and the second main surface; and a notch which has a quarter arc shape in plan view, and which is provided at the corner portion formed by a pair of adjacent side surfaces at least on a side toward the first main surface so as to extend in a thickness direction of the side surfaces, the wiring substrate being characterized in that, in each of the paired side surfaces located on opposite sides of the notch, the boundary between the groove surface and the fracture surface has a first curved portion on the corresponding side of the notch, the first curved portion being convex toward the first main surface of the substrate main body in side view, and also has a third curved portion on a second-main-surface side of the notch, the third curved portion being convex toward the second main surface of the substrate main body in side view.

The present invention also provides a third wiring substrate (claim 3), comprising a substrate main body which is formed of a plurality of stacked ceramic layers, which has a rectangular shape in plan view, which has a pair of opposite first and second main surfaces, and which has side surfaces each being located between the paired main surfaces, and having a groove surface located on a side toward the first main surface and a fracture surface located between the groove surface and the second main surface; a first notch which has a concave shape in plan view, and which is provided on a side surface at least on a side toward the first main surface so as to extend in a thickness direction of the side surface; and a second notch which has a shape similar to that of the first notch in plan view, which has a cross-sectional area smaller than that of the first notch, and which penetrates between a center portion of a bottom surface of the first notch and the second main surface so as to extend in a thickness direction of the side surface, the wiring substrate being characterized in that, in the side surface having the first notch and the second notch, the boundary between the groove surface and the fracture surface has first curved portions on opposite sides of the first notch, the first curved portions being convex toward the first main surface of the substrate main body in side view, and also has third curved portions on opposite sides of the second notch, the third curved portions being convex toward the second main surface of the substrate main body in side view.

The present invention also provides a fourth wiring substrate (claim 4), comprising a substrate main body which is formed of a plurality of stacked ceramic layers, which has a rectangular shape in plan view, which has a pair of opposite first and second main surfaces, and which has side surfaces each being located between the paired main surfaces, and having a groove surface located on a side toward the first main surface and a fracture surface located between the groove surface and the second main surface; a third notch which has a quarter arc shape in plan view, and which is provided at the corner portion formed by a pair of adjacent side surfaces at least on a side toward the first main surface so as to extend in a thickness direction of the side surfaces; and a fourth notch which has a shape similar to that of the third notch in plan view, which has a cross-sectional area smaller than that of the third notch, and which penetrates between a center portion of a bottom surface of the third notch and the second main surface so as to extend in a thickness direction of the side surfaces, the wiring substrate being characterized in that, in each of the paired adjacent side surfaces forming the corner portion having the third notch and the fourth notch, the boundary between the groove surface and the fracture surface has first curved portions on opposite sides of the third notch, the first curved portions being convex toward the first main surface of the substrate main body in side view, and also has third curved portions on opposite sides of the fourth notch, the third curved portions being convex toward the second main surface of the substrate main body in side view.

The present invention also encompasses a wiring substrate (claim 5) wherein each side surface also has a groove surface located on a side toward the second main surface, and the fracture surface is located between the first-main-surface-side groove surface and the second-main-surface-side groove surface.

The second-main-surface-side groove surface may have a belt-like shape and may extend in a longitudinal direction of the side surface. Alternatively, as in the aforementioned case, the second-main-surface-side groove surface may have curved portions (i.e., extending portions) on opposite sides of the second notch or the fourth notch.

The present invention also encompasses a wiring substrate (claim 6) wherein a conductor layer is formed so as to extend on the inner wall of the notch or each of the first to fourth notches.

The present invention also provides a multi-piece wiring substrate array (claim 7), comprising a product region having a plurality of wiring substrate units which are adjacently arranged in a matrix form, each unit being formed of a plurality of stacked ceramic layers, and having a pair of first and second main surfaces and a rectangular shape in plan view; an edge portion which is formed of the ceramic layers, which is located around the product region, and which has a pair of first and second main surfaces and has a rectangular frame shape in plan view; dividing grooves which are formed at least on the first main surface and are arranged in a lattice shape in plan view, and which are provided between adjacent wiring substrate units and between the product region and the edge portion; and first cylindrical portions each having a circular shape in plan view, being open only at the first main surface, and crossing with the corresponding dividing groove in a radial direction, the multi-piece wiring substrate array being characterized in that one or each of two dividing grooves crossing with the corresponding first cylindrical portion in a radial direction has a bottom which has first curved portions on opposite sides of the first cylindrical portion, the first curved portions being convex toward the first main surface in side view, and which also has a second curved portion on a second-main-surface side of the first cylindrical portion, the second curved portion being convex toward the second main surface in side view.

The present invention also encompasses a multi-piece wiring substrate array (claim 8) which further comprises second cylindrical portions each having a shape similar to that of the first cylindrical portion in plan view, having a cross-sectional area smaller than that of the first cylindrical portion, and penetrating between a center portion of a bottom surface of the first cylindrical portion and the second main surface so as to extend in a thickness direction of the product region, wherein one or each of two dividing grooves crossing with the corresponding first and second cylindrical portions in a radial direction has a bottom which has third curved portions on opposite sides of the second cylindrical portion, the third curved portions being convex toward the first main surface in side view.

The present invention also encompasses a multi-piece wiring substrate array (claim 9) wherein a conductor layer is formed so as to extend on the inner wall of the first cylindrical portion, or on both the inner walls of the first and second cylindrical portions.

The present invention also provides a method for producing a multi-piece wiring substrate array (claim 10), the multi-piece wiring substrate array comprising a product region having a plurality of wiring substrate units which are adjacently arranged in a matrix form, each unit being formed of a plurality of stacked ceramic layers, and having a pair of first and second main surfaces and a rectangular shape in plan view; an edge portion which is formed of the ceramic layers, which is located around the product region, and which has a pair of first and second main surfaces and has a rectangular frame shape in plan view; dividing grooves which are formed at least on the first main surface and are arranged in a lattice shape in plan view, and which are provided between adjacent wiring substrate units and between the product region and the edge portion; and first cylindrical portions each having a circular shape in plan view, being open only at the first main surface, and crossing with the corresponding dividing groove in a radial direction, characterized in that the method comprises a step of forming a plurality of penetration holes having the same or different inner diameters in some or all of a plurality of green sheets each having a rectangular shape in plan view and having a pair of first and second main surfaces; and a step of forming a plurality of dividing grooves at least on the first main surface of a green sheet laminate, the green sheet laminate being prepared through stacking of the green sheets, by continuously irradiating the green sheet laminate with a laser beam while scanning the laser beam on a position including a bottomed hole or through hole formed through communication of the penetration holes, so that the focal point of the laser beam crosses with the bottomed hole or the through hole in plan view, and so that the dividing grooves are arranged in a lattice shape in plan view so as to be provided around wiring substrate units and between a product region and an edge portion.

In the aforementioned multi-piece wiring substrate array production method, through holes, etc. are formed in a green sheet laminate through the following procedure: penetration holes are formed in each of a plurality of green sheets, and subsequently the green sheets are stacked so that the penetration holes communicate with one another.

In the aforementioned multi-piece wiring substrate array production method, the laser processing is carried out so that the focal point of the laser beam for forming the dividing grooves is maintained at a generally constant depth in a thickness direction of the green sheet laminate (including the inside of the through holes, etc.).

There may also be provided a step of forming a conductor layer on the inner wall of each of the penetration holes of the green sheets, so that a circular tubular conductor layer is formed on the inner wall of the bottomed hole or through hole of the green sheet laminate, and that the conductor layer crosses with the corresponding dividing groove.

Effects of the Invention

According to the first wiring substrate of claim 1, in the side surface having the notch, the boundary between the groove surface and the fracture surface has first curved portions on opposite sides of the notch in a longitudinal direction of the side surface, the first curved portions being convex toward the first main surface of the substrate main body in side view, and also has a second curved portion on a second-main-surface side of the notch, the second curved portion being convex toward the second main surface of the substrate main body in side view. In addition, the notch is surrounded by a pair of the first curved portions located on the opposite sides in the side surface, and the second curved portion located between the deepest portion of the notch and a second-main-surface-side portion of the side surface. Furthermore, these two types of curved portions correspond to a portion of the groove surface, which is smoother than the fracture surface, the portion being defined by a partition line and extending toward the second-main-surface side of the side surface. Therefore, generation of ceramic burrs or cracks is suppressed in the vicinity of the notch located on the first-main-surface side of the side surface, and also breakage of the conductor layer provided on the inner wall of the notch is suppressed. Thus, the wiring substrate exhibits excellent form and dimensional accuracy.

According to the second wiring substrate of claim 2, the notch is surrounded by the first curved portions located on a pair of side surfaces, and the third curved portion located between the deepest portion of the notch and a second-main-surface-side portion of each side surface. These two types of curved portions correspond to a portion of the groove surface, which is smoother than the fracture surface, the portion extending toward the second-main-surface side of the side surface. Therefore, generation of burrs or cracks is suppressed in the vicinity of the notch located at the corner portion formed by the paired side surfaces and on the first-main-surface side of the side surfaces, and also breakage of the conductor layer provided on the inner wall of the notch is suppressed. Thus, the wiring substrate exhibits excellent form and dimensional accuracy.

According to the third wiring substrate of claim 3, the first notch is sandwiched between a pair of the first curved portions located on the opposite sides of the side surface in a longitudinal direction; the second notch is sandwiched between a pair of the third curved portions located on the opposite sides of the side surface in a longitudinal direction; and the paired third curved portions are respectively adjacent to a pair of the deepest portions of the first notch (exclusive of the second notch). In addition, these two types of curved portions located at the aforementioned four positions correspond to a portion of the groove surface, which is smoother than the fracture surface, the portion extending toward the second-main-surface side of the side surface. Therefore, generation of burrs or cracks is suppressed in the vicinity of the first notch located on the first-main-surface side of the side surface, and in the vicinity of the second notch located adjacent to the first notch. Also, breakage of the conductor layer provided on the inner wall of the first or second notch is suppressed. Thus, the wiring substrate exhibits excellent form and dimensional accuracy.

According to the fourth wiring substrate of claim 4, the third notch is sandwiched between a pair of the first curved portions located on the opposite sides of the paired side surfaces in a longitudinal direction; the fourth notch is sandwiched between a pair of the third curved portions located on the opposite sides of the paired side surfaces in a longitudinal direction; and the paired third curved portions are respectively adjacent to a pair of the deepest portions of the third notch (exclusive of the fourth notch) of the paired side surfaces. In addition, these two types of curved portions located at the aforementioned four positions correspond to a portion of the groove surface, which is smoother than the fracture surface, the portion extending toward the second-main-surface side of the side surfaces. Therefore, generation of burrs or cracks is suppressed in the vicinity of the third notch located on the first-main-surface side of the side surfaces, and in the vicinity of the fourth notch located adjacent to the third notch. Also, breakage of the conductor layer provided on the inner wall of the third or fourth notch is suppressed. Thus, the wiring substrate exhibits excellent form and dimensional accuracy.

According to the wiring substrate of claim 5, a second-main-surface-side groove surface is formed in addition to the groove surface which is provided on the first-main-surface side of the side surface and which includes any of the first to fourth curved portions (i.e., extending portion), and these groove surfaces are parallel to each other. That is, the fracture surface is formed only at a position sandwiched between the paired groove surfaces. Therefore, generation of burrs, etc. is suppressed in the vicinity of any of the first to fourth notches, and also breakage of the conductor layer provided on the inner wall of any of the first to fourth notches is further suppressed. Thus, the wiring substrate exhibits further excellent form and dimensional accuracy.

According to the wiring substrate of claim 6, electrical conduction can be reliably achieved between the connection terminal of a motherboard (e.g., a printed wiring board) and the internal wiring formed on any of a plurality of ceramic layers forming the substrate main body, as well as between the connection terminal and the surface wiring formed on the second main surface (front surface), via the conductor layer formed so as to extend on the inner wall of each of the first to fourth notches. In addition, a metal (e.g., Ni or Au) plating film is reliably formed to cover an end surface of the conductor layer formed on the inner wall of each notch, the end surface (i.e., cut surface before separation of the substrate array) being exposed on the groove surface. Therefore, brazing during mounting of the wiring substrate on the motherboard can be carried out readily and securely.

According to the multi-piece wiring substrate array of claim 7, the bottom of one dividing groove which crosses with the first cylindrical portion in a radial direction and which separates the first cylindrical portion into two parts, or the bottoms of two dividing grooves which orthogonally cross each other at the first cylindrical portion and which separate the first cylindrical portion into four parts have symmetrical first curved portions on opposite sides of the first cylindrical portion in a longitudinal direction of the dividing groove(s), the first curved portions being convex toward the first main surface in side view. In addition, a second curved portion, which is convex toward the second main surface, is provided on a second-main-surface side of the first cylindrical portion. Therefore, when the product region is separated into individual wiring substrate units along the dividing grooves, ceramic burrs or cracks are less likely to be generated in the vicinity of a notch which is formed through separation of the first cylindrical portion into two parts, and which has a concave shape in plan view, or in the vicinity of a notch which is formed through separation of the first cylindrical portion into four parts, and which has a quarter arc shape in plan view. Thus, a plurality of ceramic wiring substrates exhibiting excellent form and dimensional accuracy can be reliably produced from the wiring substrate array.

According to the multi-piece wiring substrate array of claim 8, the bottom of a dividing groove which separates the first and second cylindrical portions into two or four parts in an axial direction has symmetrical first curved portions on opposite sides of the first cylindrical portion in a longitudinal direction of the dividing groove, the first curved portions being convex toward the first main surface in side view, and also has symmetrical third curved portions on opposite sides of the second cylindrical portion in a longitudinal direction of the dividing groove, the third curved portions being convex toward the first main surface in side view. Therefore, when the product region is separated into individual wiring substrate units along the dividing grooves, ceramic burrs or cracks are less likely to be generated in the vicinity of first and second notches or third and fourth notches formed through separation of the first and second cylindrical portions into two or four parts. Thus, a plurality of wiring substrates exhibiting excellent form and dimensional accuracy can be reliably produced from the wiring substrate array.

According to the multi-piece wiring substrate array of claim 9, when the product region is separated into individual wiring substrate units along the dividing grooves, ceramic burrs are less likely to be generated, and breakage of a conductor layer is suppressed in the vicinity of first and second notches or third and fourth notches formed through separation of the first and second cylindrical portions into two or four parts. In addition, a plating film (e.g., Ni or Au plating film) is formed to completely or almost completely cover an end surface of the conductor layer exposed in each dividing groove. Therefore, when the product region is separated into individual wiring substrate units, there can be reliably produced a plurality of wiring substrates each exhibiting excellent electrical conduction to an external component (e.g., a motherboard) and excellent brazing property during mounting thereof on the component.

According to the multi-piece wiring substrate array production method of claim 10, the green sheet laminate is continuously irradiated with a laser beam so that the laser beam is scanned at least on the first main surface of the laminate so as to cross with the bottomed hole or the through hole in a radial direction. Therefore, the bottom of each of lattice-shape dividing grooves formed on the first main surface has, on opposite sides of the bottomed hole or the through hole, etc., first curved portions which are convex toward the first main surface, and a second or third curved portion which is convex

BRIEF DESCRIPTION OF THE DRAWINGS

FIG. 1 is a perspective view of a first wiring substrate according to the present invention, as viewed from obliquely downward.
FIG. 2 is a perspective view of a second wiring substrate according to the present invention, as viewed from obliquely downward.
FIG. 3 is a perspective view of a third wiring substrate according to the present invention, as viewed from obliquely downward.
FIG. 4 is a perspective view of a fourth wiring substrate according to the present invention, as viewed from obliquely downward.
FIG. 5 is a side view of a wiring substrate, which is an applied embodiment of the first wiring substrate.
FIG. 6 is a side view of a wiring substrate, which is an applied embodiment of the second wiring substrate.
FIG. 7 is a side view of a wiring substrate, which is an applied embodiment of the third wiring substrate.
FIG. 8 is a side view of a wiring substrate, which is an applied embodiment of the fourth wiring substrate.
FIG. 9 is a plan view of a first multi-piece wiring substrate array according to the present invention.
FIG. 10 is a partially enlarged cross-sectional view of the multi-piece wiring substrate array of FIG. 9 taken along line X-X.
FIG. 11 is a partially enlarged cross-sectional view of a third multi-piece wiring substrate array, which is shown in a manner similar to that in FIG. 10.
FIG. 12 is a plan view of a second multi-piece wiring substrate array according to the present invention.
FIG. 13 is a partially enlarged cross-sectional view of the multi-piece wiring substrate array of FIG. 12 taken along line Y-Y.
FIG. 14 is a partially enlarged cross-sectional view of a fourth multi-piece wiring substrate array, which is shown in a manner similar to that in FIG. 13.

MODES FOR CARRYING OUT THE INVENTION

Embodiments of the present invention will next be described.

Figure 1:
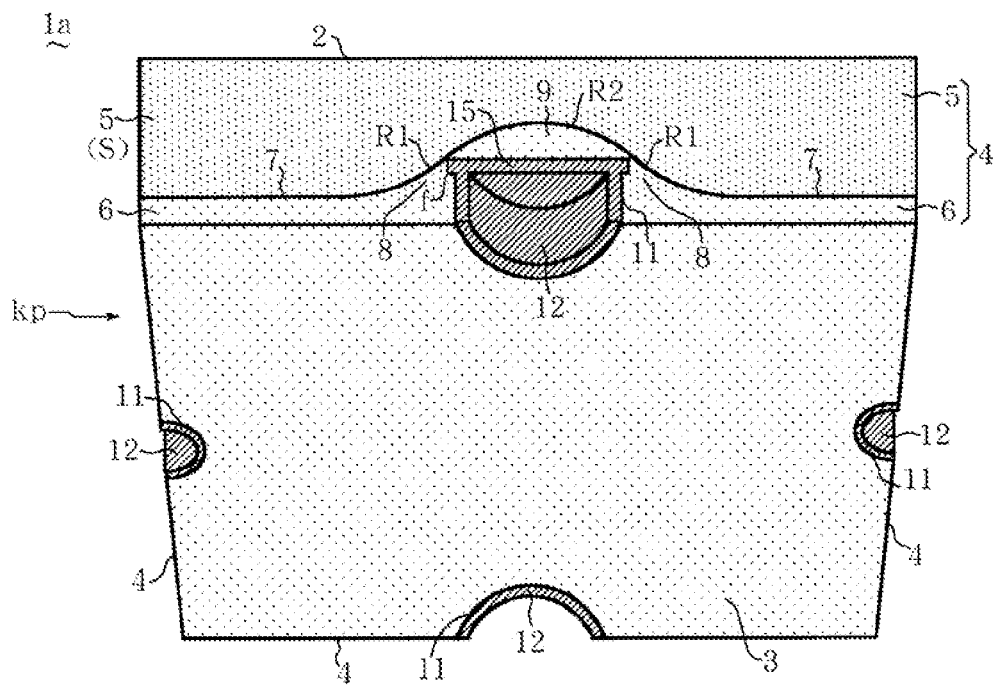
[FIG. 1]

FIG. 1 is a perspective view of a first wiring substrate 1*a* according to the present invention, as viewed from obliquely downward.

As shown in FIG. 1, the first wiring substrate 1*a* includes a substrate main body kp which is formed of a plurality of ceramic layers S (not illustrated), and which has a rectangular (or square) shape in plan view. The substrate main body kp has a pair of opposite first and second main surfaces 3 and 2, and four side surfaces 4 each being located between the paired main surfaces 3 and 2. Each side surface 4 has a notch 11 formed only on the side toward the first main surface (back surface) 3 so as to extend in a thickness direction of the side surface 4, the notch 11 having a concave (semicircular) shape in plan view, and also has a conductor layer 12 formed so as to extend on the inner wall of the notch 11.

Each side surface 4 has a groove surface 6 located on the side toward the first main surface (back surface) 3 and a fracture surface 5 (of the aforementioned ceramic layers S) located between the groove surface 6 and the second main surface (front surface) 2. The groove surface 6 corresponds to one of the inner wall surfaces of a dividing groove formed in the below-described multi-piece wiring substrate array, and is smoother than the fracture surface 5 of the ceramic layers S.

The conductor layer 12 also has, on the ceiling surface of the notch 11, a conductor layer 15 having a semicircular shape in plan view. The conductor layer 15 has a flange portion f which is provided along the outer periphery thereof, and which extends between the aforementioned ceramic layers S.

The ceramic layers S are formed of a high-temperature fired ceramic material such as alumina or mullite, or a low-temperature fired ceramic material such as glass-ceramic material. When the ceramic layers S are formed of a high-temperature fired ceramic material, the conductor layers 12 and 15 are formed of W or Mo, whereas when the ceramic layers S are formed of a low-temperature fired ceramic material, the conductor layers 12 and 15 are formed of Cu or Ag. Generally, the first main surface 3 is the back surface of the substrate main body kp, and the second main surface 2 is the front surface of the substrate main body kp. The first main surface and the second main surface are described relative to each other.

As shown in FIG. 1, in each side surface 4, the boundary 7 between the groove surface 6 and the fracture surface 5 has first curved portions R1 on opposite sides of the notch 11 and the conductor layer 12, the first curved portions R1 being symmetric with each other and convex toward the first main surface 3 in side view, and also has a second curved portion R2 on the side (toward the second main surface 2) of the notch 11 and the conductor layers 12 and 15, the second curved portion R2 being convex toward the second main surface 2 in side view. Specifically, as shown in FIG. 1, the groove surface 6 of each side surface 4 has, on opposite sides of the notch 11 and the conductor layer 12 in side view, a pair of extending portions 8 which taper toward the second main surface 2, and a semicircular extending portion 9 on the side (toward the second main surface 2) of the notch 11 and the conductor layers 12 and 15, the semicircular extending portion 9 being convex toward the second main surface 2. The extending portions 8 and 9 are formed as a portion of a dividing groove in association with formation of the dividing groove in the below-described multi-piece wiring substrate array through laser processing.

Figure 2:
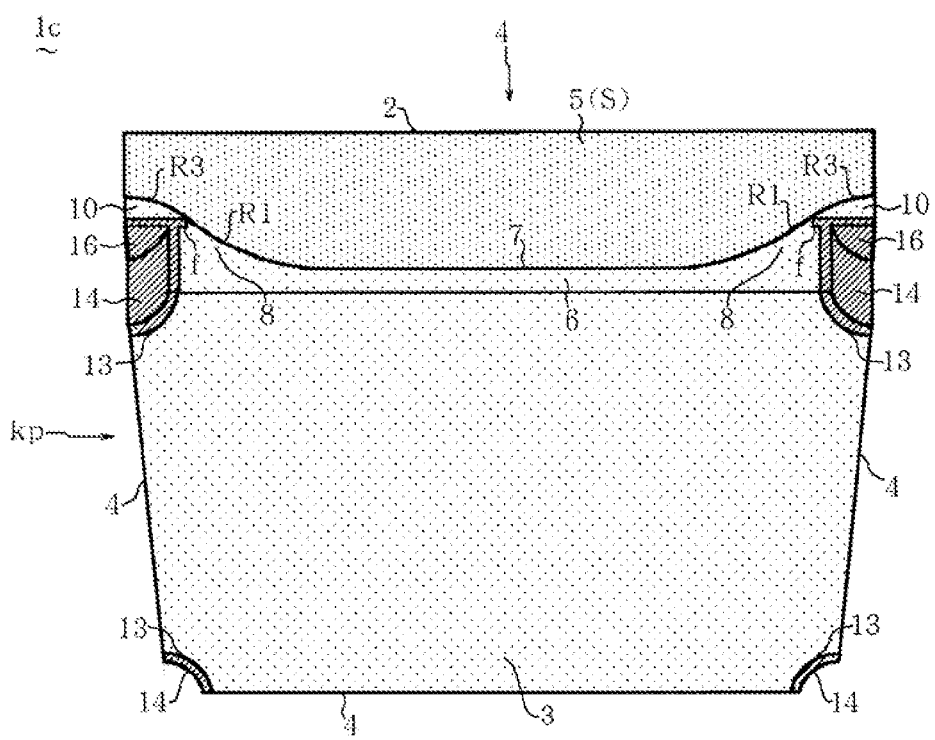
[FIG. 2]

FIG. 2 is a perspective view of a second wiring substrate 1c according to the present invention, as viewed from obliquely downward.

As shown in FIG. 2, the second wiring substrate 1c includes a substrate main body kp having first and second main surfaces 3 and 2 and side surfaces 4 as in the aforementioned case; a notch 13 having a quarter arc shape in plan view; and a conductor layer 14 similar to that described above. The notch 13 is provided at the corner portion formed by adjacent side surfaces 4, 4 only on the side toward the first main surface (back surface) 3 so as to extend in a thickness direction of the side surfaces 4. The conductor layer 14 is formed so as to extend on the inner wall of the notch 13. The conductor layer 14 also has, on the ceiling surface of the notch 13, a conductor layer 16 having a quarter arc shape in plan view. The conductor layer 16 has a flange portion f which is provided along the outer periphery thereof, and which extends between the aforementioned ceramic layers S.

As shown in FIG. 2, in the paired side surfaces 4, 4 located on opposite sides of the notch 13 and the conductor layer 14, the boundary 7 between the groove surface 6 and the fracture surface 5 has first curved portions R1 on opposite sides of the notch 13 and the conductor layer 14, the first curved portions R1 being symmetric with each other and convex toward the first main surface 3 in side view, and also has third curved portions R3 on the side (toward the second main surface 2) of the notch 13 and the conductor layer 14, the third curved portions R3 being symmetric with each other and convex toward the second main surface 2 in side view.

Specifically, as shown in FIG. 2, the groove surface 6 of each side surface 4 has, on opposite sides of the notch 13 and the conductor layer 14 in side view, extending portions 8 which are adjacent to the notch 13 and the conductor layer 14 and which taper toward the second main surface 2, and also has a quarter-arc-shaped extending portion 10 on the side (toward the second main surface 2) of the notch 13 and the conductor layer 14. The extending portions 8 and 10 are formed as a portion of a dividing groove in association with formation of the dividing groove in the below-described multi-piece wiring substrate array through laser processing.

According to the aforementioned first or second wiring substrate 1a or 1c, burrs or cracks are less likely to be generated in the ceramic layers S in the vicinity of the notch 11 or 13 located on the side (toward the first main surface 3) of the side surface 4, and breakage of the conductor layer 12 or 14 provided on the inner wall of the notch 11 or 13 is suppressed. Thus, the wiring substrate 1a or 1c exhibits excellent form and dimensional accuracy.

Electrical conduction can be reliably achieved between the connection terminal of a non-illustrated motherboard (e.g., a printed wiring board) and the internal wiring (not illustrated) formed on any of the ceramic layers S forming the substrate main body kp, as well as between the connection terminal and the surface wiring (not illustrated) formed on the second main surface 2, via the aforementioned conductor layer 12 or 14. In addition, a metal (e.g., Ni or Au) plating film is reliably formed to cover an end surface of the conductor layer 12 or 14, the end surface (i.e., cut surface before separation of the substrate array) being exposed on the groove surface 6. Therefore, brazing during mounting of the wiring substrate on the motherboard can be carried out readily and securely. Furthermore, since the width of the groove surface 6 (exclusive of a portion in the vicinity of the notch 11 or 13) is small; i.e., the width is about 20 to about 30% (50% or less) of the width of each side surface 4 as measured in a thickness direction, a plating wire for achieving electrical conduction between adjacent wiring substrate units of the multi-piece wiring substrate array can be located at a position of the fracture surface 5 in the vicinity of the boundary 7.

The notch 11 or 13 and the conductor layer 12 or 14 may be formed at least on any one of the side surfaces 4, or may be formed only between a pair of adjacent side surfaces 4, 4.

Figure 3:
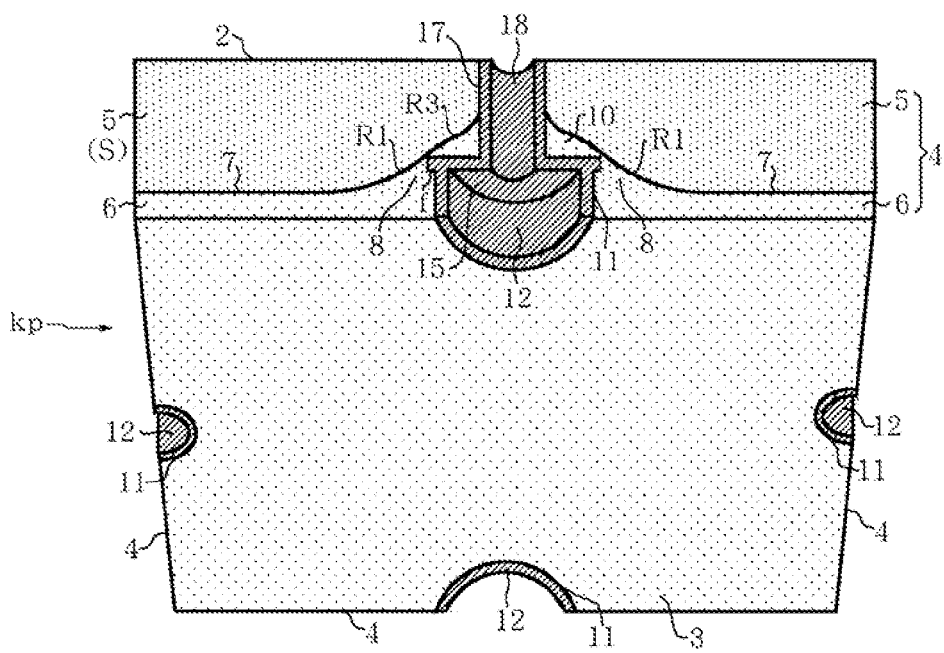
[FIG. 3]

FIG. 3 is a perspective view of a third wiring substrate 1e according to the present invention, as viewed from obliquely downward.

As shown in FIG. 3, the third wiring substrate 1e includes a substrate main body kp having first and second main surfaces 3 and 2 and side surfaces 4 as in the aforementioned case; a first notch 11 which has a concave shape in plan view, and which is formed on each side surface 4 on the side toward the first main surface (back surface) 3 so as to extend in a thickness direction of the side surface 4; a second notch 17 which has a concave shape in plan view as in the aforementioned case and has a smaller cross-sectional area, and which penetrates between a center portion of the ceiling surface (bottom surface) of the first notch 11 and the second main surface (front surface) 2; and conductor layers 12 and 18 which are respectively formed so as to extend on the inner walls of the first and second notches 11 and 17. A conductor layer 15 having a semi-ring shape in bottom view is formed on the ceiling surface of the first notch 11 for connecting the conductor layers 12 and 18. The conductor layer 15 has a flange portion f which is provided along the outer periphery thereof, and which extends between the aforementioned ceramic layers S.

As shown in FIG. 3, in each side surface 4, the boundary 7 between the groove surface 6 and the fracture surface 5 has first curved portions R1 on opposite sides of the first notch 11 and the conductor layer 12, the first curved portions R1 being symmetric with each other and convex toward the first main surface 3 in side view, and also has third curved portions R3 on opposite sides of the second notch 17 and the conductor layer 18, the third curved portions R3 being symmetric with each other and convex toward the second main surface 2 of the substrate main body kp in side view. Specifically, as shown in FIG. 3, the groove surface 6 of each side surface 4 has, on opposite sides of the first notch 11 and the conductor layer 12 in side view, a pair of extending portions 8 which taper toward the second main surface 2, and also has quarter-arc-shaped extending portions 10 on opposite sides of the second notch 17 and the conductor layer 18, the portions 10 extending toward the first notch 11. The extending portions 8 and 10 are formed in association with formation of a dividing groove in the below-described multi-piece wiring substrate array through laser processing. The extending portions 10 include horn-like portions extending along the conductor layer 18 toward the second main surface 2.

Figure 4:
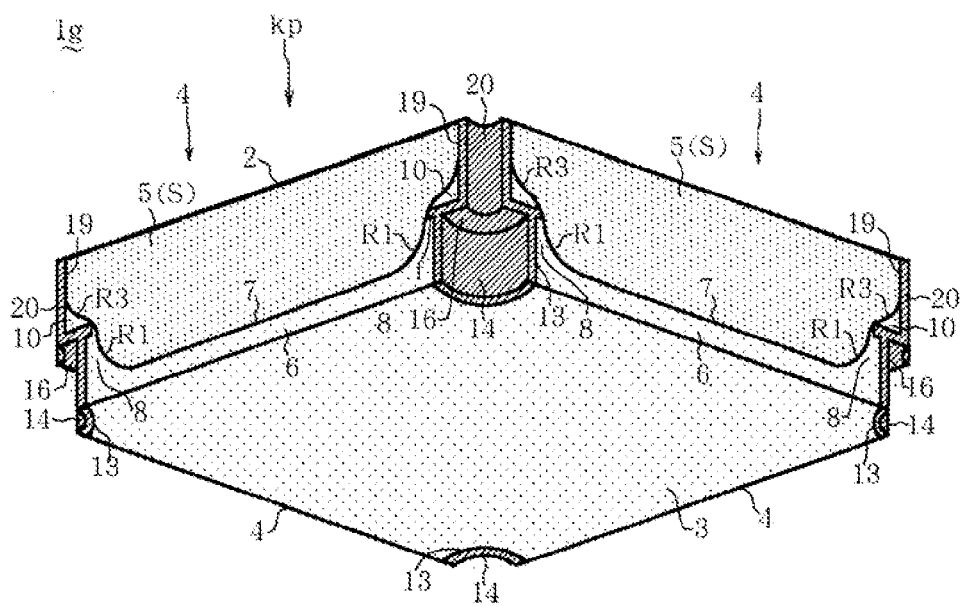
[FIG. 4]

FIG. 4 is a perspective view of a fourth wiring substrate 1g according to the present invention, as viewed from obliquely downward.

As shown in FIG. 4, the fourth wiring substrate 1g includes a substrate main body kp having first and second main surfaces 3 and 2 and side surfaces 4 as in the aforementioned case; a third notch 13 which has a quarter arc shape in plan view, and which is provided at the corner portion formed by adjacent side surfaces 4, 4 only on the side toward the first main surface (back surface) 3 so as to extend in a thickness direction of the side surfaces 4; a fourth notch 19 which has a quarter arc shape in plan view as in the aforementioned case and has a smaller cross-sectional area, and which penetrates between a center portion of the ceiling surface (bottom surface) of the third notch 13 and the second main surface (front surface) 2; and conductor layers 14 and 20 which are respectively formed so as to extend on the inner walls of the third and fourth notches 13 and 19. A conductor layer 16 having a fan-like shape in bottom view is formed on the ceiling surface of the third notch 13 for connecting the conductor layers 14 and 20. The conductor layer 16 has a flange portion f which is provided along the outer periphery thereof, and which extends between the aforementioned ceramic layers S.

As shown in FIG. 4, in the paired side surfaces 4, 4 located on opposite sides of the third notch 13 and the conductor layer 14, the boundary 7 between the groove surface 6 and the fracture surface 5 has first curved portions R1 on opposite sides of the notch 13 and the conductor layer 14, the first curved portions R1 being symmetric with each other and convex toward the first main surface 3 in side view, and also has third curved portions R3 on opposite sides (toward the third notch 13) of the fourth notch 19 and the conductor layer 20, the third curved portions R3 being symmetric with each other and convex toward the second main surface 2 in side view. Specifically, as shown in FIG. 4, the groove surface 6 of each side surface 4 has, on opposite sides of the third notch 13 and the conductor layer 14 in side view, extending portions 8 which are adjacent to the third notch 13 and the conductor layer 14 and which taper toward the second main surface 2, and also has quarter-arc-shaped extending portions 10 on opposite sides of the fourth notch 19 and the conductor layer 20, the portions 10 extending toward the third notch 13. The extending portions 8 and 10 are formed in a manner similar to that described above. The extending portions 10 include horn-like portions extending along the conductor layer 20 toward the second main surface 2.

According to the aforementioned third or fourth wiring substrate 1e or 1g, burrs or cracks are less likely to be generated in the ceramic layers S in the vicinity of any of the first to fourth notches 11, 13, 17, and 19 located on the side (toward the first main surface 3) of the side surface 4, and breakage of the conductor layer 12, 14, 18, or 20 provided on the inner wall of the notch 11, 13, 17, or 19 is suppressed. Thus, the wiring substrate 1e or 1g exhibits excellent form and dimensional accuracy.

Electrical conduction can be reliably achieved between the connection terminal of a non-illustrated motherboard (e.g., a printed wiring board) and the internal wiring formed on any of the ceramic layers S forming the substrate main body kp, as well as between the connection terminal and the surface wiring (not illustrated) formed on the second main surface 2, via the aforementioned conductor layer 12, 14, 18, or 20. In addition, a metal (e.g., Au) plating film is reliably formed to cover an end surface of the conductor layer 12, 14, 18, or 20, the end surface being exposed on the groove surface 6. Therefore, brazing during mounting of the wiring substrate on the motherboard can be carried out readily and securely. Furthermore, since the width of the groove surface 6 (exclusive of a portion in the vicinity of the notch 11, 13, 17, or 19) is small; i.e., the width is 50% or less of the width of each side surface 4 as measured in a thickness direction, a plating wire for achieving electrical conduction between adjacent wiring substrate units of the multi-piece wiring substrate array can be readily located at any position of the fracture surface 5.

The notch 11, 13, 17, or 19 and the conductor layer 12, 14, 18, or 20 may be formed at least on any one of the side surfaces 4, or may be formed only between a pair of adjacent side surfaces 4, 4.

Figure 5:
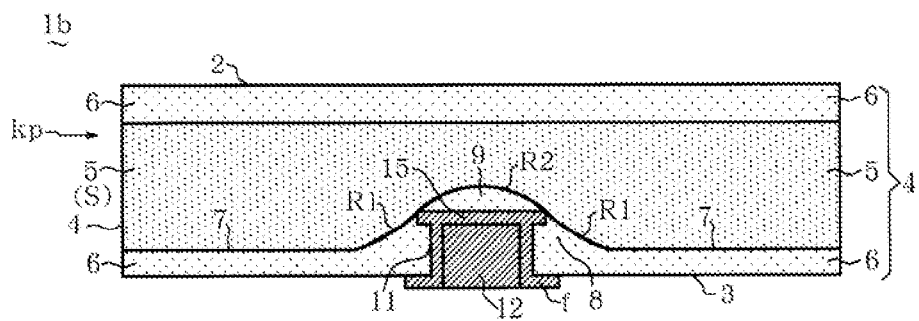
[FIG. 5]

FIG. 5 is a side view of a wiring substrate 1b, which is an applied embodiment of the first wiring substrate 1a. As shown in FIG. 5, the wiring substrate 1b includes a substrate main body kp as in the aforementioned case, and each side surface 4 of the substrate main body kp has a belt-like groove surface 6 which extends along the second main surface (front surface) 2 on the side toward the second main surface 2, in addition to a groove surface 6 on the side toward the first main surface (back surface) 3 on which a notch 11 and a conductor layer 12 are formed. Thus, in each side surface 4 of the wiring substrate 1b, a fracture surface 5 is sandwiched between the paired groove surfaces 6, 6. The total width of the paired groove surfaces 6, 6 is 50% or less of the width of the side surface 4 as measured in a thickness direction of the substrate main body kp.

Figure 6:
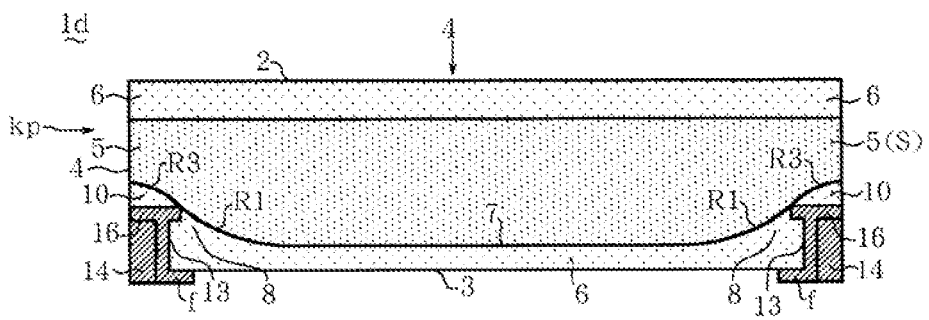
[FIG. 6]

FIG. 6 is a side view of a wiring substrate 1d, which is an applied embodiment of the second wiring substrate 1c. As shown in FIG. 6, the wiring substrate 1d includes a substrate main body kp as in the aforementioned case, and each side surface 4 of the substrate main body kp has, at the corner portion formed by adjacent side surfaces 4, 4, a belt-like groove surface 6 which extends along the second main surface (front surface) 2 on the side toward the second main surface 2, in addition to a groove surface 6 on the side toward the first main surface (back surface) 3 on which a notch 13 and a conductor layer 14 are formed. Thus, in each side surface 4 of the wiring substrate 1d, a belt-like fracture surface 5 is sandwiched between the paired groove surfaces 6, 6.

Figure 7:
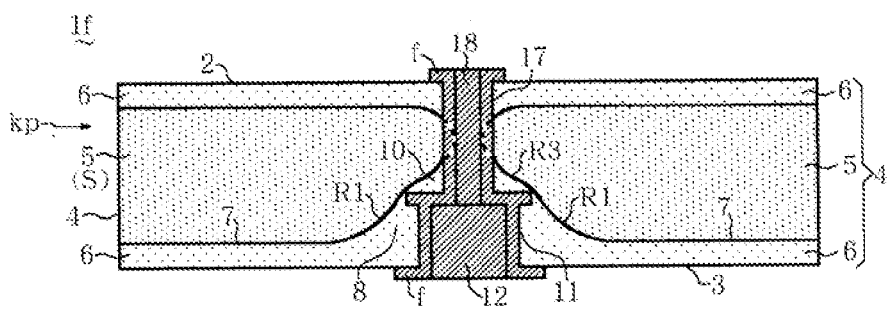
[FIG. 7]

FIG. 7 is a side view of a wiring substrate 1f, which is an applied embodiment of the third wiring substrate 1e. As shown in FIG. 7, the wiring substrate 1f includes a substrate main body kp as in the aforementioned case, and each side surface 4 of the substrate main body kp has a belt-like groove surface 6 which extends along the second main surface (front surface) 2 on the side toward the second main surface 2, in addition to a groove surface 6 on the side toward the first main surface (back surface) 3 on which a first notch 11 and a conductor layer 12 are formed. Thus, in each side surface 4 of the wiring substrate 1f, a belt-like fracture surface 5 is sandwiched between the paired groove surfaces 6, 6. The groove surface 6 on the side toward the second main surface 2 has extending portions which are provided on opposite sides of a second notch 17 and a conductor layer 18, and which taper toward the notch 17 and the layer 18.

Figure 8:
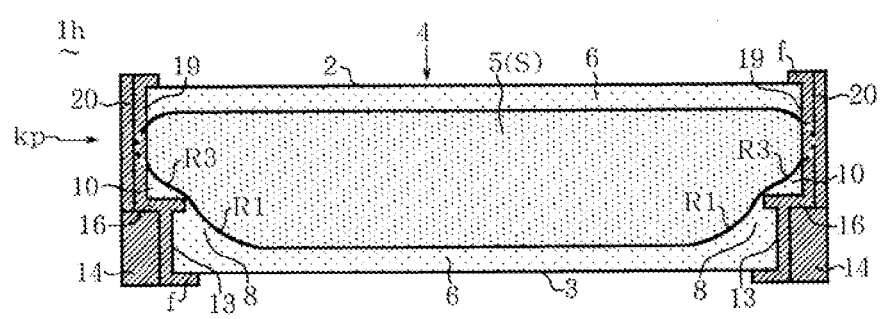
[FIG. 8]

FIG. 8 is a side view of a wiring substrate 1h, which is an applied embodiment of the fourth wiring substrate 1g. As shown in FIG. 8, the wiring substrate 1h includes a substrate main body kp as in the aforementioned case, and each side surface 4 of the substrate main body kp has, at the corner portion formed by adjacent side surfaces 4, 4, a belt-like groove surface 6 which extends along the second main surface (front surface) 2 on the side toward the second main surface 2, in addition to a groove surface 6 on the side toward the first main surface (back surface) 3 on which a notch 13 and a conductor layer 14 are formed. Thus, in each side surface 4 of the wiring substrate 1h, a belt-like fracture surface 5 is sandwiched between the paired groove surfaces 6, 6. The groove surface 6 on the side toward the second main surface 2 has extending portions which are provided on opposite sides of a fourth notch 19 and a conductor layer 20, and which taper toward the notch 19 and the layer 20.

The aforementioned wiring substrate 1b, 1d, 1f, or 1h exhibits effects similar to those obtained by the wiring substrate 1a, 1c, 1e, or 1g.

Figure 9:
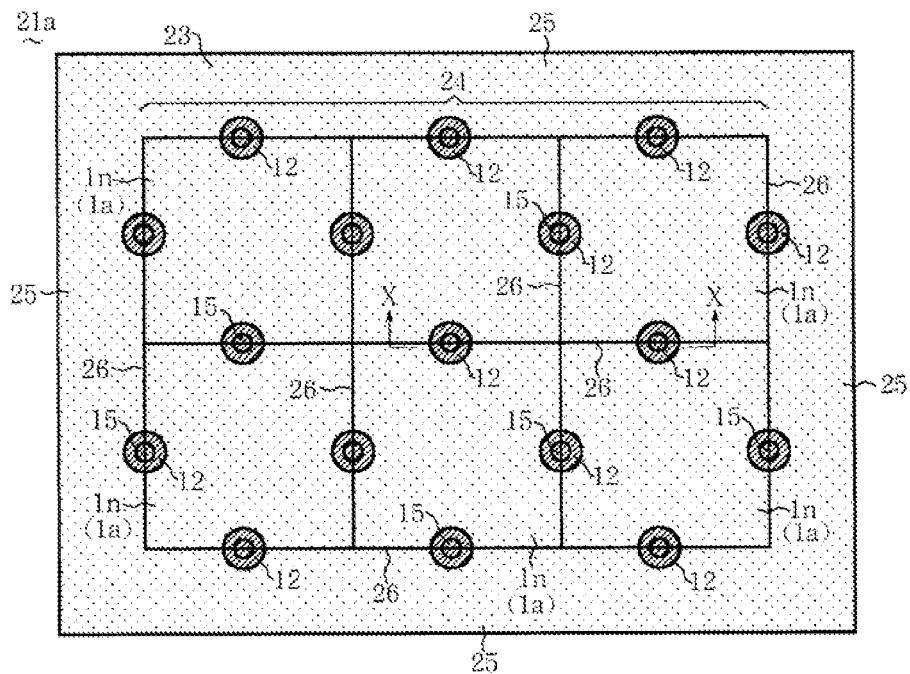
[FIG. 9]
Figure 10:
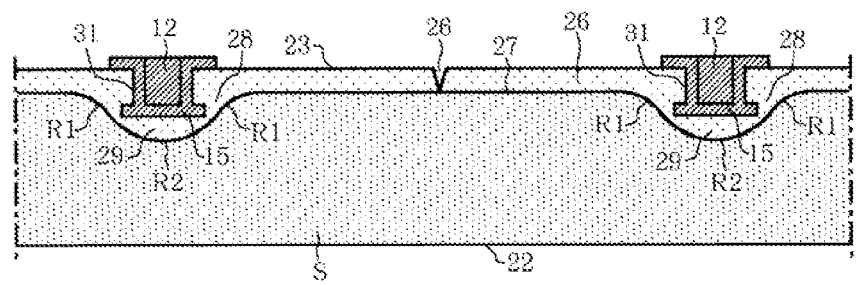
[FIG. 10]

FIG. 9 is a plan view of a first multi-piece wiring substrate array 21a according to the present invention. FIG. 10 is a partial, vertical cross-sectional view of the multi-piece wiring substrate array 21a of FIG. 9 taken along line X-X.

As shown in FIGS. 9 and 10, the multi-piece wiring substrate array 21a includes a product region 24 having a plurality of wiring substrate units in which are adjacently arranged in a matrix form, each unit being formed of a plurality of stacked ceramic layers S (not illustrated) as in the aforementioned case, and having a pair of first and second main surfaces 23 and 22 and a rectangular (or square) shape in plan view; an edge portion 25 which is formed of the ceramic layers S, which is located around the product region 24, and which has a pair of first and second main surfaces 23 and 22 and has a rectangular frame shape in plan view; dividing grooves 26 which are formed on the first main surface 23 and are arranged in a lattice shape in plan view, and which are provided between adjacent wiring substrate units 1n, in and between the product region 24 and the edge portion 25. Each of the dividing grooves 26 has a V-shaped cross section, and is formed through the below-described laser processing.

The paired main surfaces 23 and 22 are common in the wiring substrate units 1n, the product region 24, and the edge portion 25. The first main surface 23 is to become the first main surface (back surface) 3 of the wiring substrate 1a, and the second main surface 22 is to become the second main surface (front surface) 2 of the wiring substrate 1a. One of the inner wall surfaces of each dividing groove 26 is to become the groove surface 6 of each side surface 4 of the wiring substrate 1a. Each of the wiring substrate units 1n is to become the first wiring substrate 1a through separation of the multi-piece wiring substrate array 21a into individual pieces.

As shown in FIGS. 9 and 10, each of the four dividing grooves 26 surrounding each wiring substrate unit 1n has, at a middle portion thereof, a first cylindrical portion (notch: bottomed hole) 31 which has a circular shape in plan view, which is open only at the first main surface 23, and which crosses with the dividing groove 26 in a radial direction. The first cylindrical portion 31 has a circular tubular conductor layer 12 extending on the inner wall of the portion 31, and also has a disk-like conductor layer 15 which is located at the bottom of the portion 31 and is connected to the conductor layer 12. The conductor layer 12 has a ring-like flange portion extending on the first main surface 23, and the conductor layer 15 has a flange portion extending between the ceramic layers (S) toward the outer periphery thereof. Similar to the aforementioned case, the conductor layers 12 and 15 are formed of, for example, W or Mo.

As shown in FIG. 10, the bottom 27 of the dividing groove 26 crossing with the first cylindrical portion 31 and the conductor layers 12 and 15 in a radial direction has first curved portions R1 on opposite sides of the first cylindrical portion 31 and the conductor layers 12 and 15, the first curved portions R1 being convex toward the first main surface 23 in side view, and also has a second curved portion R2 on the side (toward the second main surface 22) of the first cylindrical portion 31 and the conductor layers 12 and 15, the second curved portion R2 being convex toward the second main surface 22 in side view.

Specifically, the dividing groove 26 has—on opposite sides of the first cylindrical portion 31 and the conductor layers 12 and 15 in side view (vertical cross-sectional view)—extending portions 28 which taper toward the second main surface 22, and a semicircular extending portion 29 on the side (toward the second main surface 22) of the first cylindrical portion 31 and the conductor layers 12 and 15, the semicircular extending portion 29 being convex toward the second main surface 22.

Figure 11:
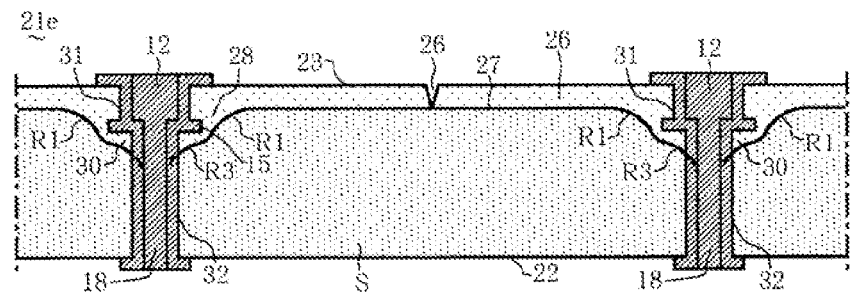
[FIG. 11]

FIG. 11 is a partial, vertical cross-sectional view of a third multi-piece wiring substrate array 21e according to the present invention, which is shown in a manner similar to that in FIG. 10.

The third multi-piece wiring substrate array 21e includes, as in the aforementioned case, a product region 24 having a plurality of wiring substrate units 1n, each of which is to become the aforementioned third wiring substrate 1e; an edge portion 25; and dividing grooves 26. As shown in FIG. 11, each of the four dividing grooves 26 surrounding each wiring substrate unit 1n has, at a middle portion thereof, a first cylindrical portion 31 which has a circular shape in plan view, which is open only at the first main surface 23, and which crosses with the dividing groove 26 in a radial direction; and also has a second cylindrical portion (notch) 32 which has a shape similar to that of the first cylindrical portion 31 in plan view, which has a diameter smaller than that of the first cylindrical portion 31, and which penetrates between a center portion of the bottom surface of the first cylindrical portion 31 and the second main surface 22 so as to extend in a thickness direction of the product region 24, the second cylindrical portion 32 concentrically communicating with the first cylindrical portion 31. Circular tubular conductor layers 12 and 18 are formed so as to extend on the inner walls of the first and second cylindrical portions 31 and 32, respectively. A disk-like conductor layer 15 is sandwiched between the conductor layers 12 and 18.

Similar to the aforementioned case, the conductor layers 12, 15, and 18 are formed of, for example, W or Mo. Each of the conductor layers has a flange portion extending in a radial direction.

As shown in FIG. 11, the bottom 27 of the dividing groove 26 crossing with the first cylindrical portion 31 and the conductor layer 12 in a radial direction has first curved portions R1 on opposite sides of the first cylindrical portion 31 and the conductor layer 12, the first curved portions R1 being convex toward the first main surface 23 in side view, and also has third curved portions R3 on opposite sides of the second cylindrical portion 32 and the conductor layer 18 and on the side toward the first cylindrical portion 31, the third curved portions R3 being convex toward the second main surface 22 in side view. Specifically, the dividing groove 26 has—on opposite sides of the first cylindrical portion 31 and the conductor layer 12 in side view (vertical cross-sectional view)—extending portions 28 which taper toward the second main surface 22, and also has—on opposite sides of the second cylindrical portion 32 and the conductor layer 18 and on the side toward the first main surface 23—quarter-arc-shaped extending portions 30 which are convex toward the second main surface 22. The dividing groove 26 having the extending portions 28 and 30 is formed through the below-described laser processing.

According to the first or third multi-piece wiring substrate array 21a or 21e, the bottom 27 of the dividing groove 26 which crosses with the first or second cylindrical portion 31 or 32 in a radial direction and which separates the first or second cylindrical portion 31 or 32 into two parts has the symmetrical first curved portions R1 on opposite sides of the first cylindrical portion 31 in a longitudinal direction of the dividing groove 26, the first curved portions R1 being convex toward the first main surface 23 in side view. In addition, the second curved portion R2, which is convex toward the second main surface 22, is provided on the side (toward the second main surface 22) of the first cylindrical portion 31, or the symmetrical third curved portions R3 are provided on opposite sides of the second cylindrical portion 32.

Therefore, when the product region 24 is separated into individual wiring substrate units 1n along the dividing grooves 26, burrs or cracks of the ceramic layers S are less likely to be generated in the vicinity of the notch 11 or 17 which is formed through axial separation of the first or second cylindrical portion 31 or 32 into two parts, and which has a concave shape in plan view. In addition, virtually no breakage occurs in the conductor layer 12 or 18 formed on the inner wall of the first or second cylindrical portion 31 or 32, and an Ni or Au plating film is reliably formed to cover an end surface of the conductor layer 12 or 18 which is exposed in the dividing groove 26. Thus, a plurality of ceramic wiring substrates 1a or 1e exhibiting excellent form and dimensional accuracy can be reliably produced from the wiring substrate array.

Belt-like dividing grooves 26 may also be formed on the second main surface 22 of the multi-piece wiring substrate array 21a or 21e shown in FIG. 10 or 11 so that the dividing grooves are arranged in lattice shape in plan view, to thereby produce a multi-piece wiring substrate array (21b or 21f) having a plurality of wiring substrate units 1n for providing the aforementioned wiring substrate 1b or 1f.

Figure 12:
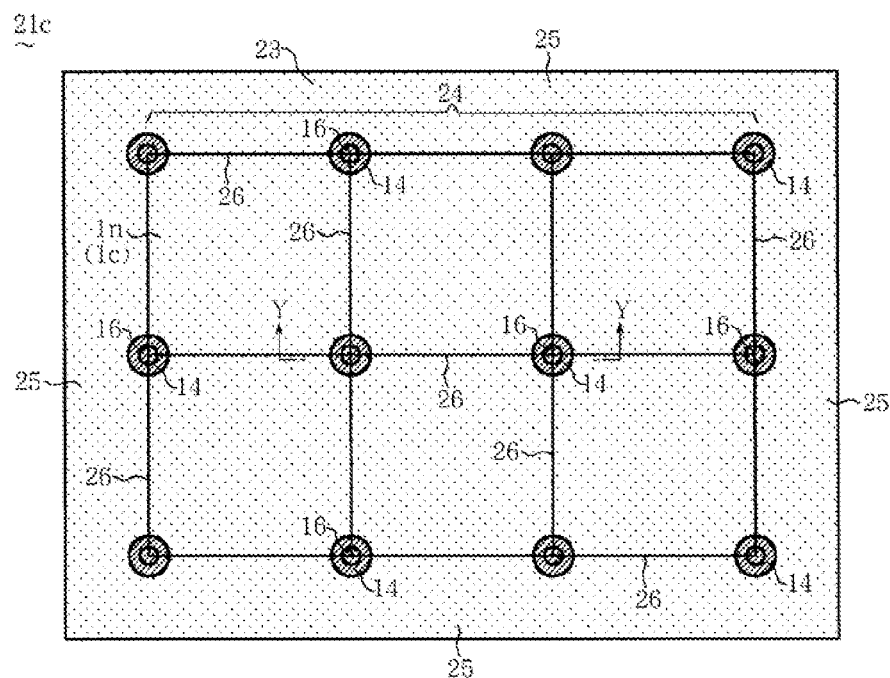
[FIG. 12]
Figure 13:
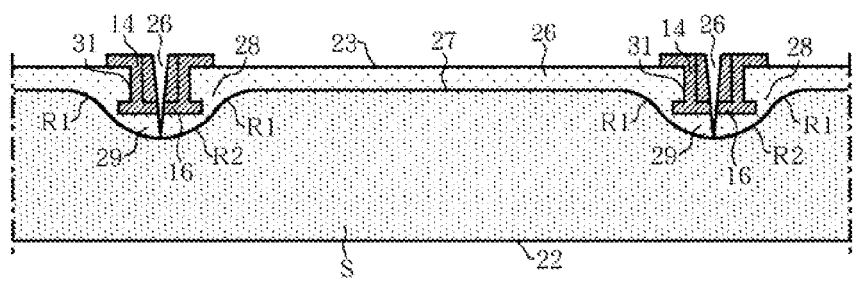
[FIG. 13]

FIG. 12 is a plan view of a second multi-piece wiring substrate array 21c according to the present invention. FIG. 13 is a partial, vertical cross-sectional view of the multi-piece wiring substrate array 21c of FIG. 12 taken along line Y-Y.

As shown in FIGS. 12 and 13, the second multi-piece wiring substrate array 21c includes, as in the aforementioned case, a product region 24 formed of the ceramic layers S, an edge portion 25, and dividing grooves 26 which are formed only on the first main surface 23 so as to be arranged in a lattice shape. Each of the wiring substrate units 1n located in the product region 24 is to become the second wiring substrate 1c through separation of the multi-piece wiring substrate array 21c into individual pieces.

As shown in FIGS. 12 and 13, each of the four dividing grooves 26 surrounding each wiring substrate unit 1n has, in the vicinity of a cross point of two adjacent dividing grooves 26, 26, a first cylindrical portion 31 which has a circular shape in plan view, which is open only at the first main surface 23, and which orthogonally crosses with the two dividing grooves 26 in a radial direction. The first cylindrical portion 31 has a circular tubular conductor layer 14 extending on the inner wall of the portion 31, and also has a conductor layer 16 (similar to that described above) which is located at the bottom of the cylindrical portion 31. Similar to the aforementioned case, the conductor layers 14 and 16 are formed of, for example, W or Mo.

As shown in FIG. 13, the bottom 27 of the two dividing grooves 26 orthogonally crossing with the first cylindrical portion 31 and the conductor layer 14 in a radial direction has first curved portions R1 on opposite sides of the first cylindrical portion 31 and the conductor layer 14, the first curved portions R1 being convex toward the first main surface 23 in side view, and also has a second curved portion R2 on the side (toward the second main surface 22) of the first cylindrical portion 31 and the conductor layers 14 and 16, the second curved portion R2 being convex toward the second main surface 22 in side view.

Specifically, the dividing groove 26 has—on opposite sides of the first cylindrical portion 31 and the conductor layer 14 in side view—extending portions 28 which taper toward the second main surface 22, and a semicircular extending portion 29 on the side (toward the second main surface 22) of the first cylindrical portion 31 and the conductor layers 14 and 16, the semicircular extending portion 29 being convex toward the second main surface 22.

Figure 14:
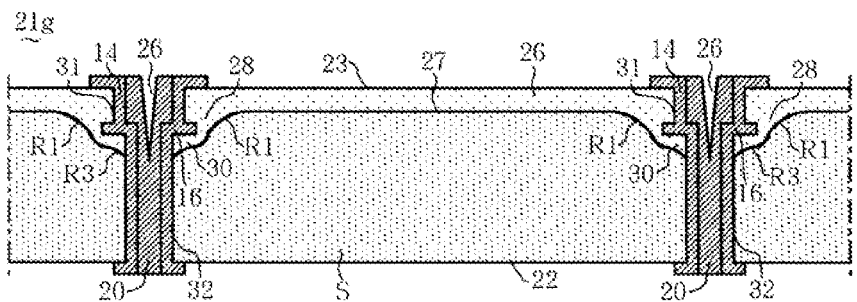
[FIG. 14]

FIG. 14 is a partial, vertical cross-sectional view of a fourth multi-piece wiring substrate array 21g according to the present invention, which is shown in a manner similar to that in FIG. 13.

The fourth multi-piece wiring substrate array 21g includes, as in the aforementioned case, a product region 24 having a plurality of wiring substrate units 1n, each of which is to become the aforementioned fourth wiring substrate 1g; an edge portion 25; and dividing grooves 26. As shown in FIG. 14, each of the four dividing grooves 26 surrounding each wiring substrate unit 1n has, in the vicinity of a cross point of two adjacent dividing grooves 26, 26, a first cylindrical portion 31 which has a circular shape in plan view, which is open only at the first main surface 23, and which crosses with the two orthogonal dividing grooves 26 in a radial direction; and also has a second cylindrical portion 32 which has a shape similar to that of the first cylindrical portion 31 in plan view, which has a diameter smaller than that of the first cylindrical portion 31, and which penetrates between a center portion of the bottom surface of the first cylindrical portion 31 and the second main surface 22 so as to extend in a thickness direction of the product region 24, the second cylindrical portion 32 concentrically communicating with the first cylindrical portion 31. Conductor layers 14 and 20 are formed on the inner walls of the first and second cylindrical portions 31 and 32, respectively, and a conductor layer 16 is sandwiched between the conductor layers 14 and 20. Similar to the aforementioned case, the conductor layers 14, 16, and 20 are formed of, for example, W or Mo.

As shown in FIG. 14, the bottom 27 of the dividing groove 26 crossing with the first cylindrical portion 31 and the conductor layer 14 in a radial direction has a pair of symmetrical first curved portions R1 on opposite sides of the first cylindrical portion 31 and the conductor layer 14, the first curved portions R1 being convex toward the first main surface 23 in side view, and also has symmetrical third curved portions R3 on opposite sides of the second cylindrical portion 32 and the conductor layer 20 and on the side toward the first cylindrical portion 31, the third curved portions R3 being convex toward the second main surface 22 in side view. Specifically, the dividing groove 26 has—on opposite sides of the first cylindrical portion 31 and the conductor layer 14 in side view—extending portions 28 which taper toward the second main surface 22, and also has—on opposite sides of the second cylindrical portion 32 and the conductor layer 20 and on the side toward the first main surface 23—quarter-arc-shaped extending portions 30 which are convex toward the second main surface 22. The dividing groove 26 having the extending portions 28 and 30 is formed through the below-described laser processing.

According to the second or fourth multi-piece wiring substrate array 21c or 21g, the bottom 27 of the two dividing grooves 26 which orthogonally cross with the first or second cylindrical portion 31 or 32 in a radial direction and which separates the first or second cylindrical portion 31 or 32 into four parts in an axial direction has the symmetrical first curved portions R1 on opposite sides of the first cylindrical portion 31 in a longitudinal direction of the dividing grooves 26, the first curved portions R1 being convex toward the first main surface 23 in side view. In addition, the second curved portion R2, which is convex toward the second main surface 22, is provided on the side (toward the second main surface 22) of the first cylindrical portion 31, or the symmetrical third curved portions R3 are provided on opposite sides of the second cylindrical portion 32. Therefore, when the product region 24 is separated into individual wiring substrate units 1n along the dividing grooves 26, burrs or cracks of the ceramic layers S are less likely to be generated in the vicinity of the notch 13 or 19 which is formed through axial separation of the first or second cylindrical portion 31 or 32 into four parts, and which has a quarter arc shape in plan view. In addition, breakage is suppressed in the conductor layer 14 or 20 formed on the inner wall of the first or second cylindrical portion 31 or 32, and an Ni or Au plating film is reliably formed to cover an end surface of the conductor layer 14 or 20 which is exposed in the dividing groove 26. Thus, a plurality of wiring substrates 1c or 1g exhibiting excellent form and dimensional accuracy can be reliably produced from the wiring substrate array.

Belt-like dividing grooves 26 may also be formed on the second main surface 22 of the multi-piece wiring substrate array 21c or 21g shown in FIG. 13 or 14 so that the dividing grooves are arranged in lattice shape in plan view, to thereby produce a multi-piece wiring substrate array (21d or 21h) having a plurality of wiring substrate units 1n for providing the aforementioned wiring substrate 1d or 1h.

Next will be described methods for producing the first and third multi-piece wiring substrate arrays 21a and 21e.

A ceramic slurry was prepared in advance by mixing alumina powder with appropriate amounts of a resin binder, a solvent, etc., and a plurality of green sheets (not illustrated) were formed from the ceramic slurry through the doctor blade method.

Subsequently, penetration holes having different inner diameters were formed at specific positions of the green sheets through punching. An electrically conductive paste containing W or Mo powder was filled into a penetration hole of small diameter, to thereby form an unfired via conductor (not illustrated), and the electrically conductive paste was applied to the inner wall of a penetration hole of large diameter under reduced pressure, to thereby form an unfired, circular tubular conductor layer.

Then, the aforementioned electrically conductive paste was applied through printing to a specific position of at least one of the front surface and back surface of each of the aforementioned green sheets, to thereby form an unfired internal wiring layer or surface wiring layer (not illustrated). A portion of the internal wiring layer may also serve as a wiring layer for plating (not illustrated).

Next, a plurality of the green sheets each having any of the aforementioned via conductor, tubular conductor layer, and wiring layer were stacked and press-bonded together.

Figure 15:
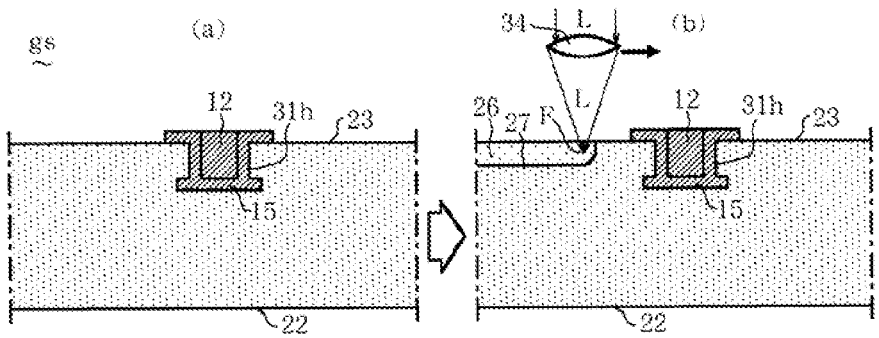
[FIG. 15]
FIG. 15 schematically shows a step of producing the first multi-piece wiring substrate array.

Thus, as shown in FIG. 15(*a*), there was produced a green sheet laminate gs having a pair of opposite first and second main surfaces 23 and 22; a bottomed hole 31h opening only at the first main surface 23; a circular tubular conductor layer 12 formed so as to extend on the inner wall of the bottomed hole 31h; and a conductor layer 15 provided at the bottom of the hole 31h.

Subsequently, as shown in FIG. 15(*b*), the first main surface 23 of the green sheet laminate gs was irradiated with a laser beam L in a thickness direction of the laminate gs, and the laser beam L was continuously scanned along the main surface 23. The laser beam L employed was, for example, a UV-YAG laser beam. The focal point F of the laser beam L was maintained at a constant depth by means of a lens 34, and the laser beam L was scanned at a constant scan rate (about 100 mm/second). In the case where a dividing groove 23 having a V-shaped cross section was formed so as to have a depth of about 200 μm and an opening width of about 50 μm, irradiation of the laser beam L was carried out under the following conditions (frequency: about 30 to about 100 Hz, repetition number: 2 to 5).

Figure 16:
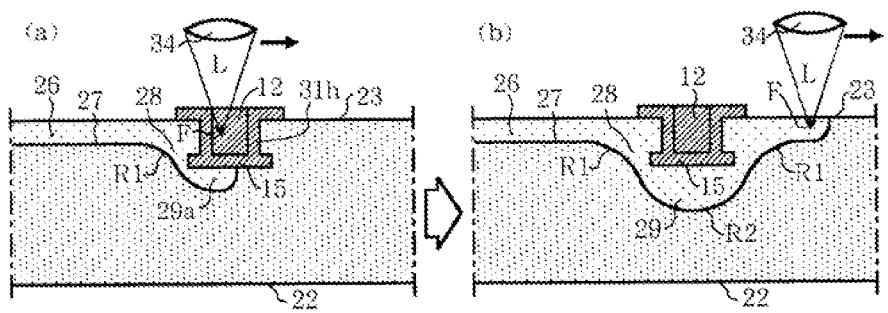
[FIG. 16]
FIG. 16 schematically shows a production step subsequent to the step shown in FIG. 15.

As shown in FIGS. 16(*a*) and 16(*b*), even when the laser beam L passed through the inside (hollow portion) of the bottomed hole 31h and the conductor layer 12 in a radial direction, the focal point F of the laser beam L, the scan rate, and the aforementioned laser irradiation conditions were maintained constant. Thus, the laser beam L was continuously caused to pass through a center portion of the bottomed hole 31h in a radial direction. In this case, the amount of energy of the laser beam L for processing was temporarily excessive at the inside (hollow portion) of the bottomed hole 31h and the conductor layer 12.

As a result, as shown in FIGS. 16(*a*) and 16(*b*), symmetrical first curved portions R1 convex toward the first main surface 23 were formed on opposite sides of the conductor layer 12 at the bottom 27 of the dividing groove 26 formed so as to cross with the bottomed hole 31h and the conductor layer 12, and a second curved portion R2 convex toward the second main surface 22 was formed below the bottomed hole 31h and the conductor layer 15. The separations grooves 26 were formed on the first main surface 23 of the green sheet laminate gs so as to be arranged in a lattice shape in plan view.

Separately, a plurality of different green sheets each having any of the aforementioned via conductor, tubular conductor layer, and wiring layer were stacked and press-bonded together. Thus, as shown in FIG. 17(*a*), there was produced a green sheet laminate gs having a pair of opposite first and second main surfaces 23 and 22; a through hole 31h opening at the first main surface 23; a through hole 32h having a smaller diameter and located between the through hole 31h and the second main surface 22, the through hole 32h concentrically communicating with the through hole 31h; conductor layers 12 and 18 provided on the inner walls of the through holes 31h and 32h, respectively; and a conductor layer 15 sandwiched between the conductor layers 12 and 18.

Figure 17:
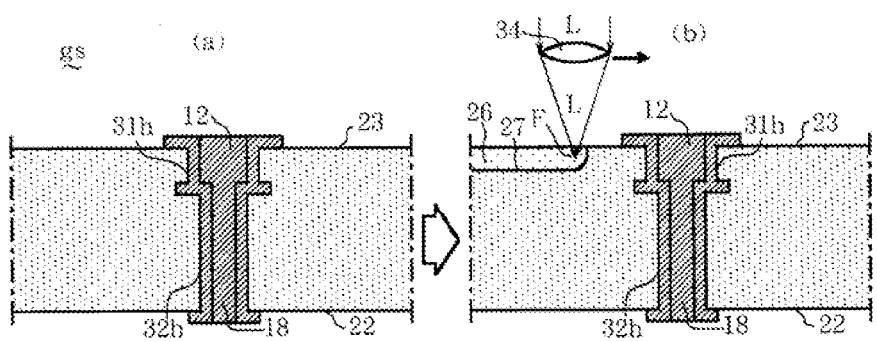
[FIG. 17]
FIG. 17 schematically shows a step of producing the second multi-piece wiring substrate array.

Subsequently, as shown in FIG. 17(*b*), the first main surface 23 of the green sheet laminate gs was irradiated with the aforementioned laser beam L in a thickness direction of the laminate gs under the same conditions as described above, and the laser beam L was continuously scanned along the main surface 23.

Figure 18:
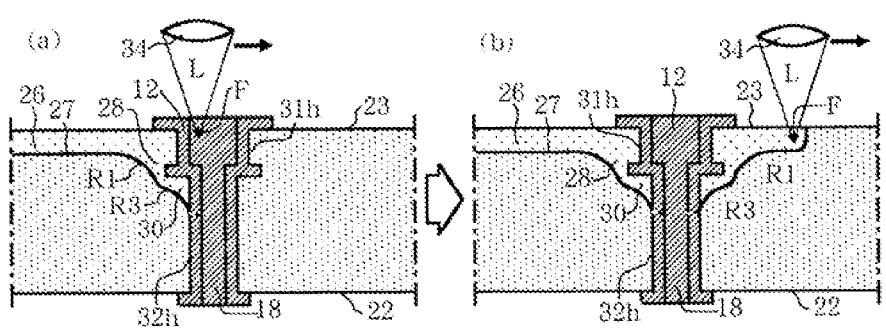
[FIG. 18]
FIG. 18 schematically shows a production step subsequent to the step shown in FIG. 17.

As shown in FIGS. 18(*a*) and 18(*b*), even when the laser beam L passed through the inside (hollow portion: through hole) of the through holes 31h and 32h and the conductor layers 12 and 18 in a radial direction, the laser irradiation conditions of the laser beam L were maintained constant. Thus, the laser beam L was continuously caused to pass through a center portion of the through holes 31h and 32h in a radial direction. In this case, the amount of energy of the laser beam L for processing was temporarily excessive at the inside (hollow portion) of the through holes 31h and 32h and the conductor layers 12 and 18.

As a result, as shown in FIGS. 18(*a*) and 18(*b*), symmetrical first curved portions R1 convex toward the first main surface 23 were formed on opposite sides of the conductor layer 12 at the bottom 27 of the dividing groove 26 formed so as to cross with the through holes 31h and 32h and the conductor layers 12 and 18, and symmetrical third curved portions R3 convex toward the second main surface 22 were formed on opposite sides of the through hole 32h and the conductor layer 18. The separations grooves 26 were formed on the first main surface 23 of the green sheet laminate gs so as to be arranged in a lattice shape in plan view.

Subsequently, these two types of green sheet laminates gs were fired at the firing temperature of the aforementioned green sheets. As a result, the green sheets were formed into integrated ceramic layers S, whereby a ceramic laminate (not illustrated) was produced. In this case, the conductor layers 12 and 18, the wiring layer of each wiring substrate 1n, etc. were also fired in parallel.

Then, by means of the aforementioned electrodes for plating, etc., the above-produced ceramic laminate was subjected to Ni electroplating and Au electroplating by immersing the laminate in specific electroplating baths sequentially. As a result, the inner walls of the conductor layers 12 and 18, etc.

were covered with an Ni plating film and an Au plating film, and the end surface (cut surface) of the conductor layer 18, the surface being located above the third curved portions R3 and exposed to the outside, was also covered with an Ni plating film and an Au plating film.

The multi-piece wiring substrate array 21*a* and 21*c* were produced through the above-described steps.

According to the aforementioned production method for the multi-piece wiring substrate array 21*a* or 21*e*, there can be effectively and reliably produced the multi-piece wiring substrate array 21*a* or 21*e*, in which each of the dividing grooves 26 formed on the main surface 23 of the product region 24 so as to be arranged in a lattice shape has the symmetrical first curved portions R1 located on opposite sides of the conductor layer 12 in side view, and also has the second curved portion R2 or a pair of the symmetrical third curved portions R3.

In addition, since the dividing grooves 26 each including the extending portions 28 to 30 can be accurately and reliably formed through laser processing employing the aforementioned laser beam L, a blade having a special shape is not required to be employed. Therefore, production cost can be reduced, and a groove formation step is readily controlled.

There may be provided a method for producing a multi-piece wiring substrate array (21*c* or 21*g*) in which each wiring substrate unit 1*n* is to become the aforementioned wiring substrate 1*c* or 1*g*, the method including a step of causing two dividing grooves 26 shown in FIGS. 15 to 18 to cross orthogonally with the bottomed hole 31*h* and the conductor layer 12, or with center portions of the through hole 31*h* and 32*h* and the conductor layers 12 and 18.

Also, there may be provided a method for producing a multi-piece wiring substrate array (21*b*, 21*d*, 21*f*, or 21*h*) in which each wiring substrate unit 1*n* is to become the aforementioned wiring substrate 1*b*, 1*d*, 1*f*, or 1*h*, the method further including a step of forming the dividing grooves 26 also on the second main surface 22 of the green sheet laminate gs so that they are in line symmetry with respect to those on the first main surface 23.

The present invention is not limited to the above-described embodiments.

For example, the ceramic layers S of the aforementioned wiring substrate or multi-piece wiring substrate array may be formed of a high-temperature fired ceramic material other than alumina (e.g., aluminum nitride or mullite), or may be formed of a low-temperature fired ceramic material such as glass-ceramic material. In the latter case, the aforementioned conductor (e.g., the conductor layer 12 or 18) is formed of Cu or Ag.

The aforementioned substrate main body or wiring substrate unit may have a rectangular shape in plan view.

The aforementioned substrate main body kp or wiring substrate unit 1*n* may be in such a form that it has a cavity which is open on the second main surface (front surface) 2 or 22 and which has a bottom surface and side surfaces.

In the multi-piece wiring substrate array production method, the laser processing may be appropriately carried out so that the laser irradiation conditions for the inside of the bottomed or through hole 31*h*, etc. differ from those for the main surface 23 of the green sheet laminate gs.

The aforementioned multi-piece wiring substrate array production method may be continuously followed by a step of separating the wiring substrate array into individual wiring substrates.

INDUSTRIAL APPLICABILITY

According to the present invention, there can be reliably provided a wiring substrate exhibiting excellent form and dimensional accuracy and having few burrs in the vicinity of a notch located on a side surface of a substrate main body, in which breakage of a conductor layer provided on the inner wall of the notch is suppressed, as well as a multi-piece wiring substrate array for providing a plurality of the wiring substrates.

DESCRIPTION OF REFERENCE NUMERALS

1*a* to 1*h*: wiring substrate
1*n*: wiring substrate unit
2, 22: second main surface/front surface
3, 23: first main surface/back surface
4: side surface
5: fracture surface
6: groove surface
7: boundary
11, 13, 17, 19: notch/first notch to fourth notch
12, 14, 18, 20: conductor layer
21*a*, 21*c*, 21*e*, 21*g*: multi-piece wiring substrate array
24: product region
25: edge portion
26: dividing groove
27: bottom of dividing groove
31, 32: first cylindrical portion, second cylindrical portion
31*h*, 32*h*: bottomed hole/through hole
S: ceramic material/ceramic layer
kp: substrate main body
R1 to R3: first curved portion to third curved portion
L: laser beam

What is claimed is:

1. A wiring substrate comprising:
    a substrate main body which is formed of a plurality of stacked ceramic layers, which has a rectangular shape in plan view, which has a pair of opposite first and second main surfaces, and which has side surfaces each being located between the paired main surfaces, and having a groove surface located on a side toward the first main surface and a fracture surface located between the groove surface and the second main surface; and
    a notch which has a concave shape in plan view, and which is provided on a side surface at least on a side toward the first main surface so as to extend in a thickness direction of the side surface, the wiring substrate being characterized in that:
    in the side surface having the notch, the boundary between the groove surface and the fracture surface has first curved portions on opposite sides of the notch, the first curved portions being convex toward the first main surface of the substrate main body in side view; and a second curved portion on a second-main-surface side of the notch, the second curved portion being convex toward the second main surface of the substrate main body in side view.

2. A wiring substrate according to claim 1, wherein each side surface also has a groove surface located on a side toward the second main surface, and the fracture surface is located between the first-main-surface-side groove surface and the second-main-surface-side groove surface.

3. A wiring substrate according to claim 1, wherein a conductor layer is formed so as to extend on the inner wall of the notch.

4. A wiring substrate comprising:
    a substrate main body which is formed of a plurality of stacked ceramic layers, which has a rectangular shape in plan view, which has a pair of opposite first and second main surfaces, and which has side surfaces each being located between the paired main surfaces, and having a groove surface located on a side toward the first main surface and a fracture surface located between the groove surface and the second main surface; and a notch which has a quarter arc shape in plan view, and which is provided at the corner portion formed by a pair of adjacent side surfaces at least on a side toward the first main surface so as to extend in a thickness direction of the side surfaces, the wiring substrate being characterized in that:

in each of the paired side surfaces located on opposite sides of the notch, the boundary between the groove surface and the fracture surface has a first curved portion on the corresponding side of the notch, the first curved portion being convex toward the first main surface of the substrate main body in side view; and a third curved portion on a second-main-surface side of the notch, the third curved portion being convex toward the second main surface of the substrate main body in side view.

5. A wiring substrate comprising:

a substrate main body which is formed of a plurality of stacked ceramic layers, which has a rectangular shape in plan view, which has a pair of opposite first and second main surfaces, and which has side surfaces each being located between the paired main surfaces, and having a groove surface located on a side toward the first main surface and a fracture surface located between the groove surface and the second main surface;

a first notch which has a concave shape in plan view, and which is provided on a side surface at least on a side toward the first main surface so as to extend in a thickness direction of the side surface; and a second notch which has a shape similar to that of the first notch in plan view, which has a cross-sectional area smaller than that of the first notch, and which penetrates between a center portion of a bottom surface of the first notch and the second main surface so as to extend in a thickness direction of the side surface, the wiring substrate being characterized in that:

in the side surface having the first notch and the second notch, the boundary between the groove surface and the fracture surface has first curved portions on opposite sides of the first notch, the first curved portions being convex toward the first main surface of the substrate main body in side view; and third curved portions on opposite sides of the second notch, the third curved portions being convex toward the second main surface of the substrate main body in side view.

6. A wiring substrate comprising:

a substrate main body which is formed of a plurality of stacked ceramic layers, which has a rectangular shape in plan view, which has a pair of opposite first and second main surfaces, and which has side surfaces each being located between the paired main surfaces, and having a groove surface located on a side toward the first main surface and a fracture surface located between the groove surface and the second main surface;

a third notch which has a quarter arc shape in plan view, and which is provided at the corner portion formed by a pair of adjacent side surfaces at least on a side toward the first main surface so as to extend in a thickness direction of the side surfaces; and a fourth notch which has a shape similar to that of the third notch in plan view, which has a cross-sectional area smaller than that of the third notch, and which penetrates between a center portion of a bottom surface of the third notch and the second main surface so as to extend in a thickness direction of the side surfaces, the wiring substrate being characterized in that:

in each of the paired adjacent side surfaces forming the corner portion and having the third notch and the fourth notch, the boundary between the groove surface and the fracture surface has first curved portions on opposite sides of the third notch, the first curved portions being convex toward the first main surface of the substrate main body in side view; and third curved portions on opposite sides of the fourth notch, the third curved portions being convex toward the second main surface of the substrate main body in side view.

7. A multi-piece wiring substrate array comprising:

a product region having a plurality of wiring substrate units which are adjacently arranged in a matrix form, each unit being formed of a plurality of stacked ceramic layers, and having a pair of first and second main surfaces and a rectangular shape in plan view;

an edge portion which is formed of the ceramic layers, which is located around the product region, and which has a pair of first and second main surfaces and has a rectangular frame shape in plan view;

dividing grooves which are formed at least on the first main surface and are arranged in a lattice shape in plan view, and which are provided between adjacent wiring substrate units and between the product region and the edge portion; and first cylindrical portions each having a circular shape in plan view, being open only at the first main surface, and crossing with the corresponding dividing groove in a radial direction, the multi-piece wiring substrate array being characterized in that:

one or each of two dividing grooves crossing with the corresponding first cylindrical portion in a radial direction has a bottom which has first curved portions on opposite sides of the first cylindrical portion, the first curved portions being convex toward the first main surface in side view, and which also has a second curved portion on a second-main-surface side of the first cylindrical portion, the second curved portion being convex toward the second main surface in side view.

8. A multi-piece wiring substrate array according to claim 7, which further comprises second cylindrical portions each having a shape similar to that of the first cylindrical portion in plan view, having a cross-sectional area smaller than that of the first cylindrical portion, and penetrating between a center portion of a bottom surface of the first cylindrical portion and the second main surface so as to extend in a thickness direction of the product region, wherein one or each of two dividing grooves crossing with the corresponding first cylindrical portion and second cylindrical portion in a radial direction has a bottom which has third curved portions on opposite sides of the second cylindrical portion, the third curved portions being convex toward the first main surface in side view.

9. A multi-piece wiring substrate array according to claim 7, wherein a conductor layer is formed so as to extend on the inner wall of the first cylindrical portion, or on both the inner walls of the first and second cylindrical portions.

10. A method for producing a multi-piece wiring substrate array, the multi-piece wiring substrate array comprising:

a product region having a plurality of wiring substrate units which are adjacently arranged in a matrix form, each unit being formed of a plurality of stacked ceramic layers, and having a pair of first and second main surfaces and a rectangular shape in plan view;

an edge portion which is formed of the ceramic layers, which is located around the product region, and which has a pair of first and second main surfaces and has a rectangular frame shape in plan view;

dividing grooves which are formed at least on the first main surface and are arranged in a lattice shape in plan view, and which are provided between adjacent wiring substrate units and between the product region and the edge portion; and first cylindrical portions each having a circular shape in plan view, being open only at the first main surface, and crossing with the corresponding dividing groove in a radial direction, characterized in that the method comprises:

a step of forming a plurality of penetration holes having the same or different inner diameters in some or all of a plurality of green sheets each having a rectangular shape in plan view and having a pair of first and second main surfaces; and a step of forming a plurality of dividing grooves at least on the first main surface of a green sheet laminate, the green sheet laminate being prepared through stacking of the green sheets, by continuously irradiating the green sheet laminate with a laser beam while scanning the laser beam on a position including a bottomed hole or through hole formed through communication of the penetration holes, so that the focal point of the laser beam crosses with the bottomed hole or the through hole in plan view, and so that the dividing grooves are arranged in a lattice shape in plan view so as to be provided around wiring substrate units and between a product region and an edge portion.

* * * * *